United States Patent
Quan et al.

(10) Patent No.: US 10,270,068 B2
(45) Date of Patent: Apr. 23, 2019

(54) PACKAGING APPARATUS AND METHOD FOR PACKAGING DISPLAY SUBSTRATE

(71) Applicants: BOE Technology Group Co., Ltd., Beijing (CN); Hefei Xinsheng Optoelectronics Technology Co., Ltd., Anhui (CN)

(72) Inventors: Wei Quan, Beijing (CN); Chia-Hao Chang, Beijing (CN); Qing Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 33 days.

(21) Appl. No.: 15/321,617

(22) PCT Filed: Mar. 15, 2016

(86) PCT No.: PCT/CN2016/076367
§ 371 (c)(1),
(2) Date: Dec. 22, 2016

(87) PCT Pub. No.: WO2016/165514
PCT Pub. Date: Oct. 20, 2016

(65) Prior Publication Data
US 2017/0214006 A1  Jul. 27, 2017

(30) Foreign Application Priority Data
Apr. 14, 2015 (CN) .......................... 2015 1 0176397

(51) Int. Cl.
*G02B 6/12* (2006.01)
*B05D 5/06* (2006.01)
(Continued)

(52) U.S. Cl.
CPC .......... *H01L 51/56* (2013.01); *B29C 63/0056* (2013.01); *B29C 63/02* (2013.01);
(Continued)

(58) Field of Classification Search
CPC ............... H04L 67/125; H04L 12/2818; H04L 12/2829; H04L 67/306; H04W 4/021;
(Continued)

(56) References Cited

U.S. PATENT DOCUMENTS 7,127,810 B2  10/2006  Kasuga et al.
7,526,858 B2   5/2009  Kasuga et al.
(Continued)

FOREIGN PATENT DOCUMENTS

CN   1453636 A    11/2003
CN   101587848 A  11/2009
(Continued)

OTHER PUBLICATIONS

International Search Report and Written Opinion of International Application No. PCT/CN2016/076367, dated May 4, 2016, 8 pages.
(Continued)

*Primary Examiner* — Brian Turner
(74) *Attorney, Agent, or Firm* — Westman, Champlin & Koehler, P.A.

(57) ABSTRACT

Embodiments of the present application provide a packaging apparatus and a method for packaging a display substrate, which belong to the technical field of display. The packaging apparatus includes a load bearing table arranged to load a substrate to be packaged, wherein the load bearing table includes at least one movable portions that are movable in a direction perpendicular to the substrate to be packaged. The present application can reduce the stripes on the surface of the substrate to be packaged and to enhance display effects.

12 Claims, 4 Drawing Sheets

(51) Int. Cl.
 *C08F 2/46*  (2006.01)
 *H01L 51/56*  (2006.01)
 *B32B 7/12*  (2006.01)
 *B32B 37/10*  (2006.01)
 *H01L 51/52*  (2006.01)
 *B29C 63/00*  (2006.01)
 *B29C 63/02*  (2006.01)
 *B29L 31/34*  (2006.01)

(52) U.S. Cl.
 CPC ............... *B32B 7/12* (2013.01); *B32B 37/10* (2013.01); *H01L 51/5237* (2013.01); *B29L 2031/3475* (2013.01); *B32B 2457/206* (2013.01)

(58) Field of Classification Search
 CPC .. H04W 4/027; H04W 4/043; H05B 37/0272; H05B 37/0227
 See application file for complete search history.

(56) References Cited

U.S. PATENT DOCUMENTS

| | | | |
|---|---|---|---|
| 7,976,750 B2 | 7/2011 | Burmeister et al. | |
| 2004/0000368 A1* | 1/2004 | Kasuga | B23K 26/0608 156/64 |
| 2006/0063309 A1* | 3/2006 | Sugiyama | H01L 21/7806 438/118 |
| 2009/0206707 A1* | 8/2009 | Iyoki | B82Y 35/00 310/369 |
| 2013/0147129 A1* | 6/2013 | Chiu | H01L 21/6831 279/3 |

FOREIGN PATENT DOCUMENTS

| | | |
|---|---|---|
| CN | 202977538 U | 6/2013 |
| CN | 103257006 A | 8/2013 |
| CN | 104339808 A | 2/2015 |
| CN | 104810483 A | 7/2015 |
| WO | 2013/043375 A1 | 3/2013 |
| WO | 2013/043376 A1 | 3/2013 |

OTHER PUBLICATIONS

English translation of Box No. V of the Written Opinion for the International Searching Authority for International Application No. PCT/CN2016/076367 (incorrectly cited on document), 2 pages.
First Office Action, including Search Report, for Chinese Patent Application No. 201510176397.4, dated Aug. 1, 2016, 6 pages.
Second Office Action, including Search Report, for Chinese Patent Application No. 201510176397.4, dated Dec. 12, 2016, 12 pages.

* cited by examiner

PACKAGING APPARATUS AND METHOD FOR PACKAGING DISPLAY SUBSTRATE

CROSS-REFERENCE TO RELATED APPLICATION

This application is a 371 National Stage application of International Application No. PCT/CN2016/076367, filed on 15 Mar. 2016, which published as WO 2016/165514 on 20 Oct. 2016, and claims priority to Chinese patent Application No. 201510176397.4, filed with SIPO on 14 Apr. 2015, which is incorporated herein by reference in their entirety.

BACKGROUND OF THE DISCLOSURE

Field of the Disclosure

The present disclosure relates to the technical field of display, and in particular, to a packaging apparatus and a method for packaging a display substrate.

Description of the Related Art

An organic electroluminescent device (for example an organic light emitting diode (OLED)) has been used widely due to its characteristics such as low power consumption, low weight, high brightness, wide field-of-view, high contrast and rapid response speed. In production of the OLED, it needs to be packaged.

In the prior art, a laminator is used to paste a laminar adhesive onto a surface of the OLED to finish the package of the OLED. The laminator may include a glass load bearing table having a load bearing face which faces downward. The glass load bearing table adsorbs the OLED such that the OLED is fixed onto the load bearing surface of the glass load bearing table. When the OLED is packaged, the laminar adhesive may be arranged below the OLED, that is, the laminar adhesive contacts with the OLED, and a rolling shaft is forced to roll against the surface of the laminar adhesive. The rolling shaft applies a pressure onto the laminar adhesive while it rolls, such that the laminar adhesive becomes in close contact with the OLED to finish the package of the OLED.

SUMMARY

The present disclosure provides a packaging apparatus and a method for packaging a display substrate. The exemplary embodiments are provided as follow:

An embodiment of the present application provides a packaging apparatus including including a load bearing table arranged to bear a substrate to be packaged, wherein the load bearing table includes at least one movable portions that are movable in a direction perpendicular to the substrate to be packaged.

In an embodiment, the load bearing table further includes a processor and a pressure sensor connected electrically to each other, and wherein the pressure sensor is arranged on a surface of a side of the load bearing table facing towards the substrate to be packaged and is arranged to generate a pressure value corresponding to each movable portion on the basis of a pressure between a rolling shaft and the each movable portion on the load bearing table; and wherein the processor is arranged to acquire the pressure value corresponding to the each movable portion and generated by the pressure sensor.

In an embodiment, the packaging apparatus further includes an adjusting device connected electrically to the processor, wherein the processor is also configured to control the adjusting device to adjust a position of the each movable portion on the load bearing table on the basis of the pressure value corresponding to the each movable portion.

In an embodiment, the adjusting device includes a cylinder.

In an embodiment, the load bearing table includes a plurality of the movable portions that are connected together by vacuum absorption ports.

In an embodiment, the movable portions are arranged in a matrix form.

An embodiment of the present application provides a method for packaging a display substrate by using the above packaging apparatus, the method including:

generating the pressure value corresponding to each movable portion on the basis of the pressure between a rolling shaft and the each movable portion on the load bearing table by using a pressure sensor;

acquiring the pressure value corresponding to the each movable portion by using a processor, the pressure value being generated by the pressure sensor; and controlling the adjusting device to adjust the position of the each movable portion on the load bearing table on the basis of the pressure value corresponding to the each movable portion by using the processor.

In an embodiment, controlling the adjusting device to adjust the position of the each movable portion on the load bearing table on the basis of the pressure value corresponding to the each movable portion by using the processor includes:

comparing the pressure value with a predetermined reference value in terms of magnitude by the processor;

in response to the pressure value greater than the predetermined reference value, acquiring a difference between the pressure value and the predetermined reference value by the processor and controlling the adjusting device to drive the movable portion corresponding to the pressure value to move upwardly in the direction perpendicular to the substrate to be packaged on the basis of an absolute value of the difference;

otherwise, in response to the pressure value smaller than the predetermined reference value, acquiring a difference between the pressure value and the predetermined reference value by the processor and controlling the adjusting device to drive the movable portion corresponding to the pressure value to move downwardly in the direction perpendicular to the substrate to be packaged on the basis of an absolute value of the difference.

In an embodiment, before generating the pressure value corresponding to each movable portion on the basis of the pressure between a rolling shaft and the each movable portion on the load bearing table by using a pressure sensor, the method further includes:

fixing the substrate to be packaged onto a load bearing surface of the load bearing table such that a face of the substrate opposite to a packaging face of the substrate comes into contact with the load bearing surface of the load bearing table; and forcing the rolling shaft to roll against the packaging face of the substrate to be packaged and applying a pressure onto the load bearing table by the rolling shaft while it is rolling.

In an embodiment, after controlling the adjusting device to adjust the position of the each movable portion on the load bearing table on the basis of the pressure value corresponding to the each movable portion by using the processor, the method further includes:

arranging a laminar adhesive onto a packaging face of the substrate to be packaged; and forcing the rolling shaft to roll against a surface of the laminar adhesive to package the substrate by the laminar adhesive.

BRIEF DESCRIPTION OF THE DRAWINGS

In order that technical solutions of embodiments may become more explicit, the drawings that are needed to describe the embodiments will below be explained briefly. Apparently, the following drawings only show some of embodiments of the present application. The skilled person in the art also may obtain other drawings from these drawings without any creative efforts.

From the above drawings, the specific embodiments of the present application have been illustrated. More details will be described below. These drawings and literal description are intended to explain the concept of the present application to the skilled person in the art with reference to the specific embodiments, other than limit the scope of the concept of the present application in any ways.

DETAILED DESCRIPTION OF PREFERRED EMBODIMENTS OF THE DISCLOSURE

In order that objects, technical solutions and advantages of the present disclosure may become more apparent, embodiments of the present application will be further explained below with reference to drawings.

An embodiment of the present application provides a packaging apparatus, the packaging apparatus including a load bearing table arranged to bear a substrate to be packaged, wherein the load bearing table includes at least one movable portions that are movable in a direction perpendicular to the substrate to be packaged.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
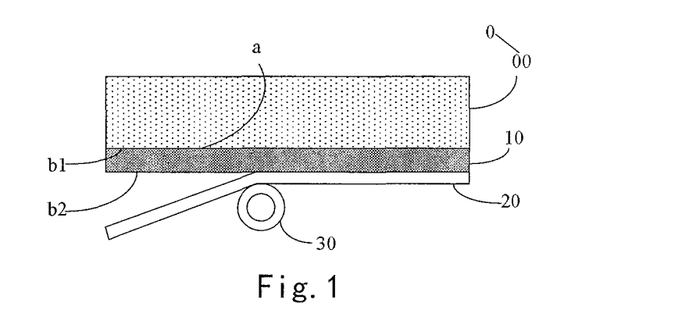
FIG. 1 is a schematic view showing a scene in which a packaging apparatus provided by an embodiment of the present application is applied.

As illustrated in FIG. 1, it shows a scene in which a packaging apparatus provided by an embodiment of the present application is applied. The packaging apparatus 0 may include a load bearing table 00. The load bearing table 00 may for example have a downward load bearing face a. The substrate 10 to be packaged may be arranged below the load bearing table 00, that is, the face b1 of the substrate 10 to be packaged opposite to its packaging face b2 may contact with the load bearing face a of the load bearing table 00. When the substrate 10 is packaged, a laminar adhesive 20 may be arranged below the substrate 10, that is, the laminar adhesive 20 contacts with the packaging face b2 of the substrate 10. And a rolling shaft 30 is provided to roll against a surface of the laminar adhesive 20. When the rolling shaft 30 rolls, the rolling shaft 30 applies a pressure to the laminar adhesive 20 such that the laminar adhesive 20 contacts closely with the packaging face b2 of the substrate 10 to be packaged.

Figure 2:
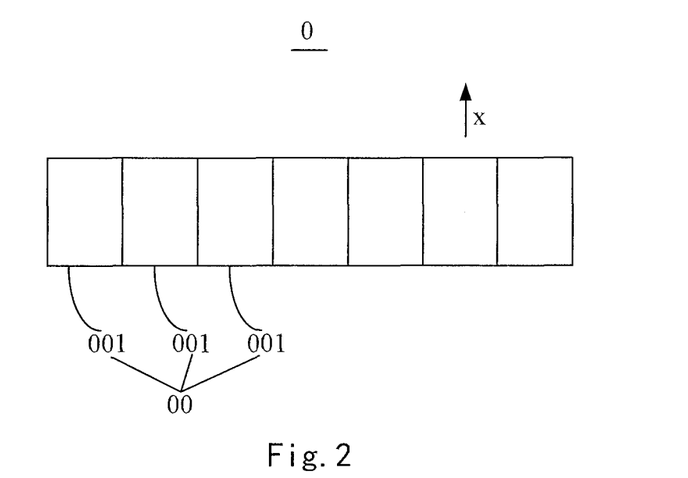
FIG. 2 is a schematic view showing a structure of a packaging apparatus provided by an embodiment of the present application.

As illustrated in FIG. 2, an embodiment of the present application provides a packaging apparatus 0. The packaging apparatus 0 may include a load bearing table 00 arranged to load the substrate 10 shown in FIG. 1 to be packaged. The load bearing table 00 may include at least one movable portions 001 that are movable in a direction perpendicular to the substrate 10 to be packaged. As an example, the direction in which the movable portions 001 move may be a direction x (shown in FIG. 2). The at least one movable portions 001 may move various areas of the load bearing face a of the load bearing table 00 in the direction perpendicular to the substrate 10 to be packaged.

As discussed above, in the packaging apparatus provided by the embodiment of the present application, a plurality of movable portions that are movable in a direction perpendicular to the substrate 10 to be packaged are provided. Thus, during packaging operation, a position of each movable portion may be correspondingly adjusted on the basis of the pressure condition between the rolling shaft and the load bearing table in various areas, such that the pressures between the rolling shaft and all of the movable portions on the load bearing table are equal and thus the pressures that are applied by the rolling shaft to all of areas on the laminar adhesive while it rolls are equal. Therefore, same deformation may occur in various areas on the surface of the laminar adhesive to reduce the stripes on the surface of the substrate to be packaged by the laminar adhesive and to enhance display effects.

Figure 3:
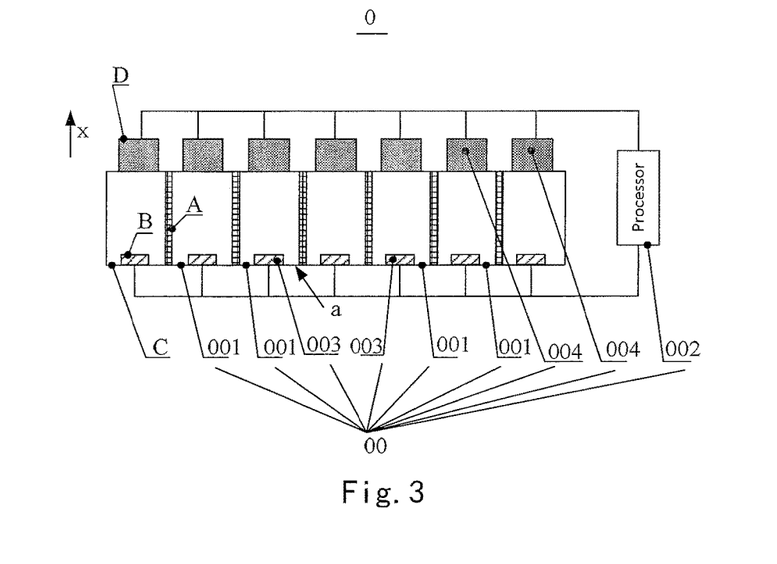
FIG. 3 is a schematic view showing a structure of another packaging apparatus provided by an embodiment of the present application.

Further, as shown in FIG. 3, an embodiment of the present application provides another packaging apparatus 0. The packaging apparatus 0 may include a load bearing table 00. The load bearing table 00 may further includes a processor 002, a pressure sensor 003 and an adjusting device 004. The processor 002 may be connected electrically to the pressure sensor 003 and the adjusting device 004 respectively. As an example, the pressure sensor 003 may be arranged on a surface of a side of the load bearing table 00 facing towards the substrate to be packaged, that is, the load bearing face a of the load bearing table 00. The pressure sensor 003 may be arranged to generate a pressure value corresponding to each movable portion 001 on the basis of a pressure between a rolling shaft 30 shown in FIG. 1 and the each movable portion 001 on the load bearing table 00. After the pressure sensor 003 generates the pressure value, the processor 002 may be arranged to acquire the pressure value corresponding to the each movable portion 001, generated by the pressure sensor 003. The processor 002 is also configured to control the adjusting device 004 to adjust a position of the each movable portion 001 on the load bearing table on the basis of the pressure value corresponding to the each movable portion 001.

In an example, as shown in FIG. 3, a plurality of pressure sensors 003 and a plurality of adjusting devices 004 may be provided in the packaging apparatus 0, and there may be one to one correspondences between the pressure sensors 003 and the movable portions 001 and between the adjusting devices 004 and the movable portions 001. The correspondence between the pressure sensors 003 and the movable portions 001 and the correspondence between the movable portions 001 and the adjusting devices 004 may be stored in the processor 002. If the pressure sensor B of the plurality of pressure sensors 003 corresponds to the movable portion C, then the movable portion C will correspond to the adjusting device D.

Before packaging the substrate to be packaged, the substrate may be fixed to the load bearing face of the load bearing table and a rolling shaft is forced to roll against the packaging face of the substrate. A pressure may be generated between the rolling shaft and each movable portion 001 on the load bearing table 00 while the rolling shaft rolls. After the pressure is generated between the movable portion C and the rolling shaft, the pressure sensor B may generate the pressure value corresponding to the movable portion C on the basis of the pressure between the rolling shaft and the movable portion C. The pressure 002 may acquire the pressure value generated by the pressure sensor B. And the processor 002 may acquire a marker of the pressure sensor B that generates the pressure value while it acquires the pressure value generated by the pressure sensor B. A marker of the movable portion C corresponding to the pressure sensor B is acquired on the basis of the correspondence between the pressure sensor 003 and the movable portion 001 and the marker of the pressure sensor B. Then a marker of the adjusting device D corresponding to the movable portion C is acquired on the basis of the marker of the movable portion C and the correspondence between the movable portion 001 and the adjusting device 004.

After acquiring the marker of the adjusting device D, the processor 002 may control the adjusting device D to adjust a position of the movable portion C on the load bearing table 00 on the basis of the pressure value. In particular, the adjusting device D may be arranged on the movable portion C on the load bearing table 00. The processor 002 may be configured to control the adjusting device D to move upwardly or downwardly in a direction x perpendicular to the substrate to be packaged, so as to drive the movable portion 001 on the load bearing table 00 to move upwardly or downwardly in the direction x perpendicular to the substrate to be packaged. As an example, the adjusting device 004 may be a cylinder. A predetermined reference value may be provided in the processor 002. The processor 002 may compare the pressure value with the predetermined reference value in terms of magnitude, and acquire a difference between the pressure value and the predetermined reference value. If the pressure value is greater than the predetermined reference value, the processor 002 may control the adjusting device D to move upwardly by a corresponding distance in the direction x perpendicular to the substrate to be packaged and drive the movable portion 001 on the load bearing table 00 to move upwardly by the corresponding distance in the direction perpendicular to the substrate to be packaged, on the basis of the difference between the pressure value and the predetermined reference value; otherwise, if the pressure value is smaller than the predetermined reference value, the processor 002 may control the adjusting device D to move downwardly by a corresponding distance in the direction x perpendicular to the substrate to be packaged and drive the movable portion 001 on the load bearing table 00 to move downwardly by the corresponding distance in the direction x perpendicular to the substrate to be packaged, on the basis of the difference between the pressure value and the predetermined reference value.

The correspondence between the difference between the pressure value and the predetermined reference value and the distance by which the movable portion moves may also be provided in the processor 002. Assuming that the predetermined reference value is 1 N (Newton), if the pressure value generated by the pressure sensor B and acquired by the processor 002 is 5 N, the pressure value will be greater than the predetermined reference value and the difference between the pressure value and the predetermined reference value is 4 N, thus, the processor 002 may control the adjusting device D to move upwardly by a moving distance corresponding to 4N in the direction x perpendicular to the substrate to be packaged, so as to drive the movable portion 001 on the load bearing table 00 to move upwardly by the moving distance corresponding to 4N in the direction x perpendicular to the substrate to be packaged. If the pressure value generated by the pressure sensor B and acquired by the processor 002 is 0 N, the pressure value will be smaller than the predetermined reference value and the difference between the pressure value and the predetermined reference value is 1 N, thus, the processor 002 may control the adjusting device D to move downwardly by a moving distance corresponding to 1 N in the direction x perpendicular to the substrate to be packaged, so as to drive the movable portion 001 on the load bearing table 00 to move downwardly by the moving distance corresponding to 1 N in the direction x perpendicular to the substrate to be packaged.

Then, the laminar adhesive may be arranged below the substrate to be packaged, that is, the laminar adhesive contacts with the packaging face of the substrate to be packaged, and a rolling shaft is forced to roll against a surface of the laminar adhesive, such that the laminar adhesive contacts closely with the substrate to be packaged to finish the packaging of the substrate. After the movable portion 001 on the load bearing table 00 is adjusted, the pressures between the rolling shaft and all of the movable portions 001 on the load bearing table 00 are equal and thus the pressures that are applied by the rolling shaft to all of areas on the laminar adhesive while the rolling shaft rolls are equal. Therefore, same deformation may occur in various areas on the surface of the laminar adhesive to reduce the stripes on the surface of the substrate to be packaged by the laminar adhesive and to enhance display effects.

With reference to FIG. 3, the load bearing table 00 includes a plurality of the movable portions 001 that may be connected together by vacuum absorption ports A. Use of the vacuum absorption ports A to connect the plurality of the movable portions 001 may cause relatively small relative displacements among the plurality of the movable portions 001 when the movable portions are telescopically adjusted based on pressure feedback. Thus, the effects on the total flatness of the load bearing face of the load bearing table 00 may be reduced when the positions of the plurality of movable portions 001 are adjusted. It should be noted that the plurality of movable portions 001 may be arranged in matrix, or the plurality of movable portions 001 may be arranged in other forms. The embodiments of the present application are not limited by this.

As discussed above, in the packaging apparatus provided by the embodiment of the present application, a plurality of movable portions that are movable in the direction perpendicular to the substrate 10 to be packaged are provided. Thus, during packaging operation, a position of each movable portion may be adjusted on the basis of the pressure condition between the rolling shaft and the load bearing table in various areas, such that the pressures between the rolling shaft and all of the movable portions on the load bearing table are equal and thus the pressures that are applied by the rolling shaft to all of areas on the laminar adhesive while it rolls are equal. Therefore, same deformation may occur in various areas on the surface of the laminar adhesive to reduce the stripes on the surface of the substrate to be packaged by the laminar adhesive and to enhance display effects.

Figure 4:
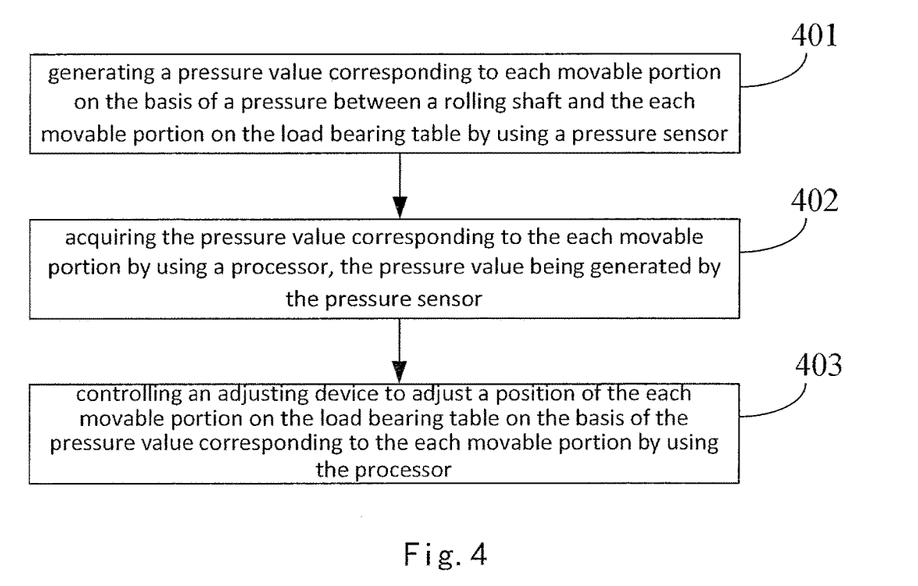
FIG. 4 shows a flow chart of a method for packaging a display substrate provided by an embodiment of the present application.

As illustrated in FIG. 4, an embodiment of the present application provides a method for packaging a display substrate. The method may be carried out by using the packaging apparatus shown in FIG. 2 or FIG. 3. The method may include:

Step 401 of generating a pressure value corresponding to each movable portion on the basis of a pressure between a rolling shaft and the each movable portion on the load bearing table by using a pressure sensor;

Step 402 of acquiring the pressure value corresponding to the each movable portion by using a processor, the pressure value being generated by the pressure sensor; and Step 403 of controlling an adjusting device to adjust a position of the each movable portion on the load bearing table on the basis of the pressure value corresponding to the each movable portion by using the processor.

As discussed above, in the method for packaging a display substrate provided by the embodiment of the present application, the processor may control a plurality of movable portions on the load bearing table to move in the direction perpendicular to the substrate 10 to be packaged on the basis of the pressure between the load bearing table and the rolling shaft in various areas. Thus, during packaging operation, each movable portion may be adjusted correspondingly on the basis of the pressure condition between the rolling shaft and the load bearing table in various areas, such that the pressures between the rolling shaft and all of the movable portions on the load bearing table are equal and thus the pressures that are applied by the rolling shaft to all of areas on the laminar adhesive while the rolling shaft rolls are equal. Therefore, same deformation may occur in various areas on the surface of the laminar adhesive to reduce the stripes on the surface of the substrate to be packaged by the laminar adhesive and to enhance display effects.

As an example, the Step 403 may include:

comparing the pressure value with a predetermined reference value in terms of magnitude by the processor; in response to the pressure value greater than the predetermined reference value, acquiring a difference between the pressure value and the predetermined reference value by the processor and controlling the adjusting device to drive the movable portion corresponding to the pressure value to move upwardly in a direction perpendicular to the substrate to be packaged on the basis of an absolute value of the difference; otherwise, in response to the pressure value smaller than the predetermined reference value, acquiring a difference between the pressure value and the predetermined reference value by the processor and controlling the adjusting device to drive the movable portion corresponding to the pressure value to move downwardly in the direction perpendicular to the substrate to be packaged on the basis of an absolute value of the difference.

As discussed above, in the method for packaging a display substrate provided by the embodiment of the present application, the processor may control a plurality of movable portions on the load bearing table to move in the direction perpendicular to the substrate to be packaged on the basis of the pressure between the load bearing table and the rolling shaft in various areas. Thus, during packaging operation, each movable portion may be adjusted on the basis of the pressure condition between the rolling shaft and the load bearing table in various areas, such that the pressures between the rolling shaft and all of the movable portions on the load bearing table are equal and thus the pressures that are applied by the rolling shaft to all of areas on the laminar adhesive while the rolling shaft rolls are equal. Therefore, same deformation may occur in various areas on the surface of the laminar adhesive to reduce the stripes on the surface of the substrate to be packaged by the laminar adhesive and to enhance display effects.

Figure 5:
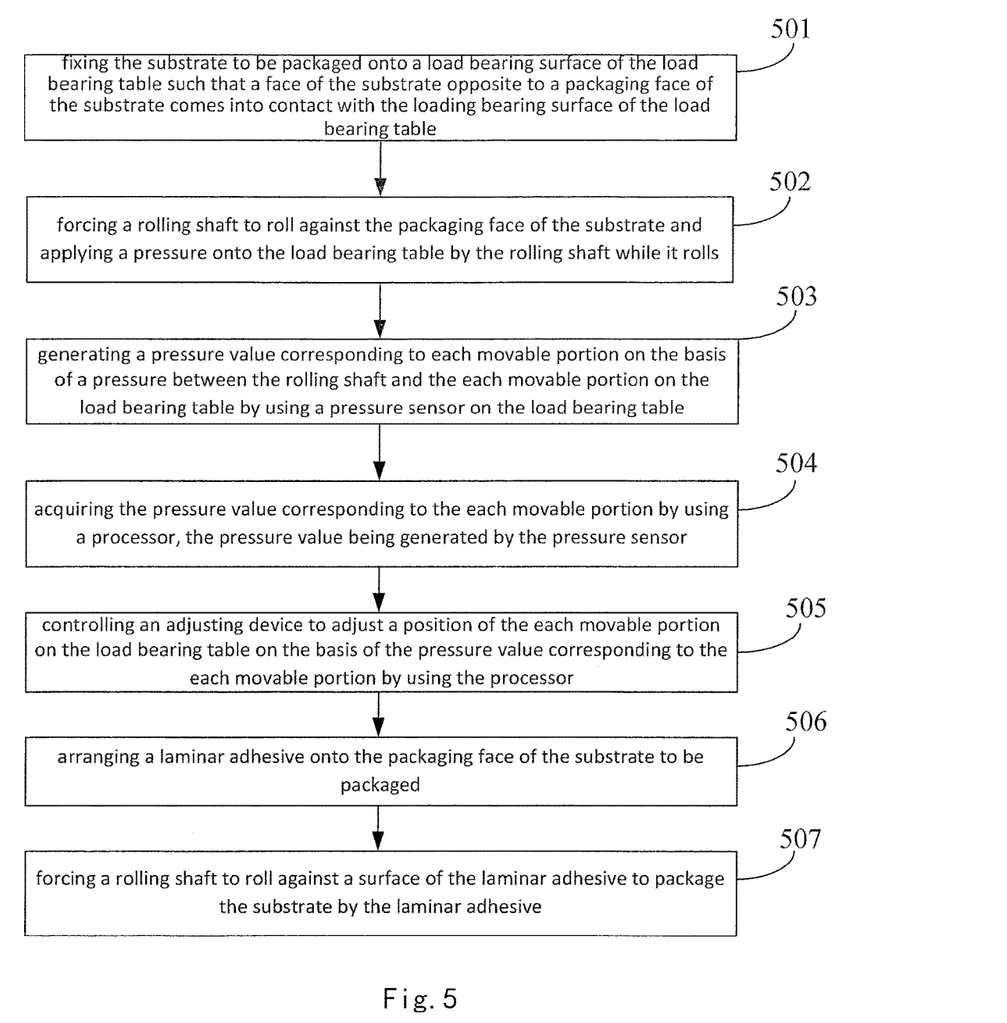
FIG. 5 shows a flow chart of another method for packaging a display substrate provided by an embodiment of the present application.

As illustrated in FIG. 5, an embodiment of the present application provides another method for packaging a display substrate. The method may be carried out by using the packaging apparatus shown in FIG. 2 or FIG. 3. The method may include:

Step 501 of fixing the substrate to be packaged onto a load bearing surface of the load bearing table such that a face of the substrate opposite to a packaging face of the substrate comes into contact with the loading bearing surface of the load bearing table.

As an example, the load bearing face of the load bearing table may be located at bottom of the load bearing table and the load bearing table may adsorb the substrate to the load bearing face of the load bearing table. And the face of the substrate opposite to the packaging face contacts with the load bearing face of the load bearing table such that the substrate to be packaged is fixed onto the load bearing face of the load bearing table.

Step 502 of forcing a rolling shaft to roll against the packaging face of the substrate and applying a pressure onto the load bearing table by the rolling shaft while it rolls.

The rolling shaft may roll in a lengthwise direction of the substrate to be packaged and apply the pressure onto the packaging face of the substrate to be packaged when it rolls on the packaging face of the substrate.

Step 503 of generating a pressure value corresponding to each movable portion on the basis of a pressure between the rolling shaft and the each movable portion on the load bearing table by using a pressure sensor on the load bearing table.

With reference to FIG. 3, if a pressure sensor B of the plurality of pressure sensors 003 corresponds to a movable portion C, then the movable portion C will correspond to an adjusting device D. After a pressure between the movable portion C and the rolling shaft is generated, the pressure sensor B may generate the pressure value corresponding to the movable portion C on the basis of the pressure between the movable portion C and the rolling shaft.

Step 504 of acquiring the pressure value corresponding to the each movable portion by using a processor, the pressure value being generated by the pressure sensor.

Because the processor and the pressure sensor are connected to each other, the processor may acquire the pressure value corresponding to the each movable portion after the pressure sensor generates the pressure value corresponding to the each movable portion.

Step 505 of controlling an adjusting device to adjust a position of the each movable portion on the load bearing table on the basis of the pressure value corresponding to the each movable portion by using the processor.

Figure 6:
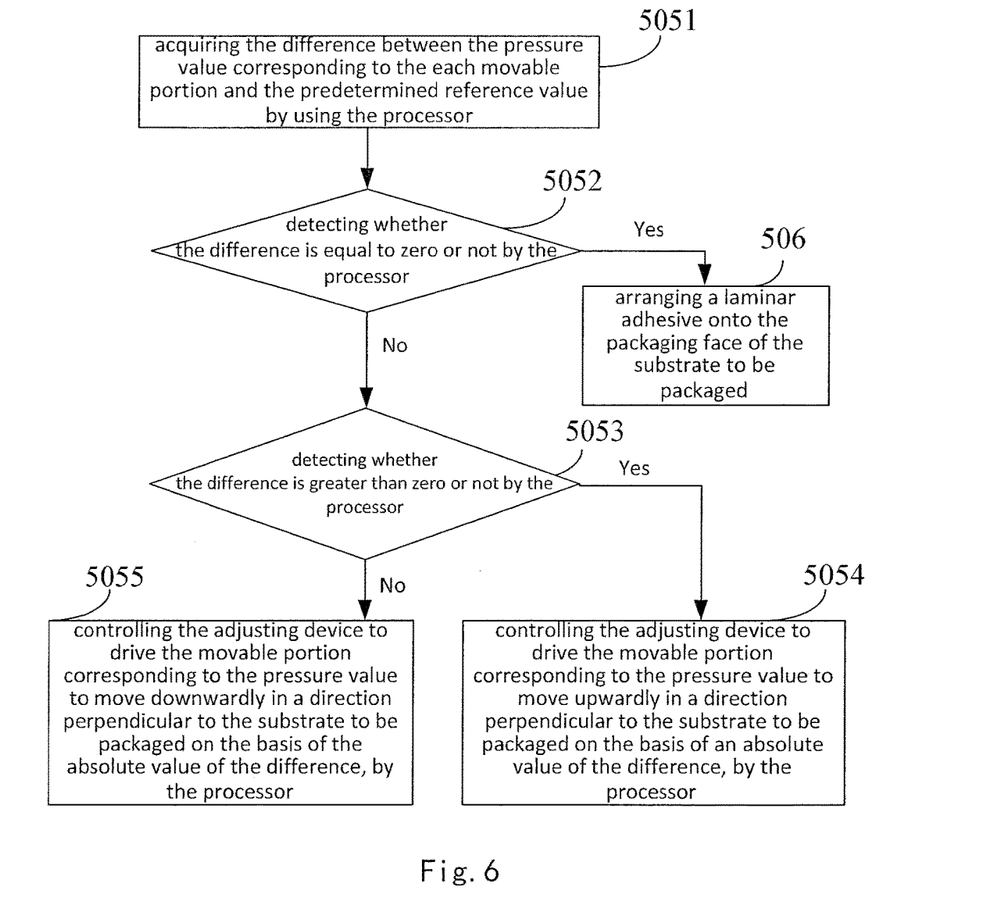
FIG. 6 shows a flow chart of a method for adjusting movable portions provided by an embodiment of the present application.

In particular, as shown in FIG. 6, the Step 505 may include:

Step 5051 of acquiring the difference between the pressure value corresponding to the each movable portion and the predetermined reference value by using the processor. Then the Step 5052 will be performed.

As an example, the predetermined reference value may be stored in the processor. After acquiring the pressure value corresponding to each movable portion, the processor may subtract the predetermined reference value from the pressure value corresponding to the each movable portion to acquire the difference between the pressure value corresponding to the each movable portion and the predetermined reference value.

Step 5052 of detecting whether the difference is equal to zero or not by the processor; if yes, the Step 506 is performed, otherwise, if no, the Step 5053 is performed.

If the difference between the pressure value and the predetermined reference value is equal to zero, the processor may not process it and the Step 506 is directly performed.

Step 5053 of detecting whether the difference is greater than zero or not by the processor; if yes, the Step 5054 is performed, otherwise, if no, the Step 5055 is performed.

Step 5054 of controlling the adjusting device to drive the movable portion corresponding to the pressure value to move upwardly in a direction perpendicular to the substrate to be packaged on the basis of an absolute value of the difference, by the processor.

If the difference between the pressure value and the predetermined reference value is greater than zero, that is, the pressure value is greater than the predetermined reference value; then the processor may control the adjusting device to drive the movable portion corresponding to the pressure value to move upwardly in a direction perpendicular to the substrate to be packaged. In particular, a plurality of pressure sensors and a plurality of adjusting devices may be provided in the packaging apparatus, and there may be one to one correspondences between the pressure sensors and the movable portions and between the adjusting devices and the movable portions. The correspondence between the pressure sensors and the movable portions and the correspondence between the movable portions and the adjusting devices may be stored in the processor. It should be noted that, in the Step 503, the processor 002 shown in FIG. 3 may acquire a marker of the pressure sensor B that generates the pressure value while it acquires the pressure value generated by the pressure sensor B. A marker of the movable portion C corresponding to the pressure sensor B is acquired on the basis of the correspondence between the pressure sensor 003 and the movable portion 001 and the marker of the pressure sensor B. Then a marker of the adjusting device D corresponding to the movable portion C is acquired on the basis of the marker of the movable portion C and the correspondence between the movable portion 001 and the adjusting device 004. In particular, the adjusting device D may be arranged on the movable portion C on the load bearing table 00. The adjusting device 004 may be a cylinder.

If the pressure value is greater than the predetermined reference value, the processor 002 may control the adjusting device D to move upwardly by a corresponding distance in a direction x perpendicular to the substrate to be packaged on the basis of the difference between the pressure value and the predetermined reference value and thus drive the movable portion 001 on the load bearing table 00 to move upwardly by the corresponding distance in the direction x perpendicular to the substrate to be packaged. The correspondence between the difference between the pressure value and the predetermined reference value and the distance by which the movable portion moves may also be provided in the processor 002. Assuming that the predetermined reference value is 1N (Newton), if the pressure value generated by the pressure sensor B and acquired by the processor 002 is 5 N, the pressure value will be greater than the predetermined reference value and the difference between the pressure value and the predetermined reference value is 4 N, thus, the processor 002 may control the adjusting device D to move upwardly by a moving distance corresponding to 4 N in the direction x perpendicular to the substrate to be packaged, so as to drive the movable portion 001 on the load bearing table 00 to move upwardly by the moving distance corresponding to 4 N in the direction x perpendicular to the substrate to be packaged.

Step 5055 of controlling the adjusting device to drive the movable portion corresponding to the pressure value to move downwardly in a direction perpendicular to the substrate to be packaged on the basis of the absolute value of the difference, by the processor.

If the difference between the pressure value and the predetermined reference value is smaller than zero, that is, the pressure value is smaller than the predetermined reference value; the processor may control the adjusting device to drive the movable portion corresponding to the pressure value to move downwardly in a direction perpendicular to the substrate to be packaged. As an example, a plurality of pressure sensors and a plurality of adjusting devices may be provided in the packaging apparatus, and there may be one to one correspondences between the pressure sensors and the movable portions and between the adjusting devices and the movable portions. The correspondence between the pressure sensors and the movable portions and the correspondence between the movable portions and the adjusting devices may be stored in the processor. It should be noted that, in the Step 503, the processor 002 shown in FIG. 3 may acquire a marker of the pressure sensor B that generates the pressure value while it acquires the pressure value generated by the pressure sensor B. A marker of the movable portion C corresponding to the pressure sensor B is acquired on the basis of the correspondence between the pressure sensor 003 and the movable portion 001 and the marker of the pressure sensor B. Then a marker of the adjusting device D corresponding to the movable portion C is acquired on the basis of the marker of the movable portion C and the correspondence between the movable portion 001 and the adjusting device 004. In particular, the adjusting device D may be arranged on the movable portion C on the load bearing table 00. The adjusting device 004 may be a cylinder.

If the pressure value is smaller than the predetermined reference value, the processor 002 may control the adjusting device D to move downwardly by a corresponding distance in a direction x perpendicular to the substrate to be packaged on the basis of the difference between the pressure value and the predetermined reference value and thus drive the movable portion 001 on the load bearing table 00 to move downwardly by the corresponding distance in the direction x perpendicular to the substrate to be packaged. The correspondence between the difference between the pressure value and the predetermined reference value and the distance by which the movable portion moves may also be provided in the processor 002. If the pressure value generated by the pressure sensor B and acquired by the processor 002 is ON, the pressure value will be smaller than the predetermined reference value and the difference between the pressure value and the predetermined reference value is 1 N, thus, the processor 002 may control the adjusting device D to move downwardly by a moving distance corresponding to 1 N in the direction x perpendicular to the substrate to be packaged, so as to drive the movable portion 001 on the load bearing table 00 to move downwardly by the moving distance corresponding to 1 N in the direction x perpendicular to the substrate to be packaged.

Step 506 of arranging a laminar adhesive onto the packaging face of the substrate to be packaged.

In particular, the laminar adhesive may be arranged below the substrate to be packaged, i.e., the laminar adhesive contacts with the packaging face of the substrate to be packaged.

Step 507 of forcing a rolling shaft to roll against a surface of the laminar adhesive to package the substrate by the laminar adhesive.

The rolling shaft is forced to roll against the surface of the laminar adhesive such that the laminar adhesive contacts closely with the substrate to be packaged to finish the packaging of the substrate. After the movable portion on the load bearing table is adjusted, the pressures between all of the movable portions on the load bearing table and the rolling shaft are equal. Thus, the pressures that are applied by the rolling shaft to all of areas on the laminar adhesive while the rolling shaft rolls, are equal. Therefore, same deformation may occur in various areas on the surface of the laminar adhesive to reduce the stripes on the surface of the substrate to be packaged by the laminar adhesive and to enhance display effects.

As discussed above, in the method for packaging a display substrate provided by the embodiment of the present application, the processor may control a plurality of movable portions on the load bearing table to move in the direction perpendicular to the substrate to be packaged on the basis of the pressure between the load bearing table and the rolling shaft in various areas. Thus, during packaging operation, each movable portion may be adjusted on the basis of the pressure condition between the rolling shaft and the load bearing table in various areas, such that the pressures between the rolling shaft and all of the movable portions on the load bearing table are equal and thus the pressures that are applied by the rolling shaft to all of areas on the laminar adhesive while the rolling shaft rolls are equal. Therefore, same deformation may occur in various areas on the surface of the laminar adhesive to reduce the stripes on the surface of the substrate to be packaged by the laminar adhesive and to enhance display effects.

All of the above optional technical solution may be combined in any forms to form newly optional embodiments of the present application. The details on these embodiments will be omitted herein.

The above embodiments are exemplary embodiments of the present application, instead of limiting the present application. Various alternations, modifications or equivalents made in these embodiments without departing from the principles and spirit of the disclosure will also fall within the protection scope of the present invention.

What is claimed is:

1. A packaging apparatus, comprising a load bearing table arranged to bear a substrate to be packaged,
   wherein the load bearing table comprises a plurality of movable portions that are movable in a direction perpendicular to the substrate to be packaged, wherein the plurality of movable portions are connected together by vacuum absorption ports,
   wherein the load bearing table further comprises a processor and a pressure sensor connected electrically to each other, and
   wherein the pressure sensor is arranged on a surface of a side of the load bearing table facing towards the substrate to be packaged and is arranged to generate a pressure value corresponding to each movable portion on the basis of a pressure applied to a laminar adhesive arranged on a surface of the substrate by a rolling shaft; and
   wherein the processor is arranged to acquire the pressure value corresponding to said each movable portion and generated by the pressure sensor.

2. The packaging apparatus according to claim 1, further comprising an adjusting device connected electrically to the processor, wherein the processor is also configured to control the adjusting device to adjust a position of said each movable portion on the load bearing table on the basis of the pressure value corresponding to said each movable portion.

3. The packaging apparatus according to claim 2, wherein the adjusting device comprises a cylinder.

4. A method for packaging a display substrate by using the packaging apparatus according to claim 3, the method comprising:
   generating the pressure value corresponding to each movable portion on the basis of the pressure between a rolling shaft and said each movable portion on the load bearing table by using a pressure sensor;
   acquiring the pressure value corresponding to said each movable portion by using a processor, the pressure value being generated by the pressure sensor; and
   controlling the adjusting device to adjust the position of said each movable portion on the load bearing table on the basis of the pressure value corresponding to said each movable portion by using the processor.

5. The method according to claim 4, wherein controlling the adjusting device to adjust the position of said each movable portion on the load bearing table on the basis of the pressure value corresponding to said each movable portion by using the processor comprises:
   comparing the pressure value with a predetermined reference value in terms of magnitude by the processor;
   in response to the pressure value greater than the predetermined reference value, acquiring a difference between the pressure value and the predetermined reference value by the processor and controlling the adjusting device to drive the movable portion corresponding to the pressure value to move upwardly in the direction perpendicular to the substrate to be packaged on the basis of an absolute value of the difference;
   otherwise, in response to the pressure value smaller than the predetermined reference value, acquiring a difference between the pressure value and the predetermined reference value by the processor and controlling the adjusting device to drive the movable portion corresponding to the pressure value to move downwardly in the direction perpendicular to the substrate to be packaged on the basis of an absolute value of the difference.

6. The method according to claim 4, wherein before generating the pressure value corresponding to each movable portion on the basis of the pressure between a rolling shaft and said each movable portion on the load bearing table by using a pressure sensor, the method further comprises:

fixing the substrate to be packaged onto a load bearing surface of the load bearing table such that a face of the substrate opposite to a packaging face of the substrate comes into contact with the load bearing surface of the load bearing table; and forcing the rolling shaft to roll against the packaging face of the substrate to be packaged and applying a pressure onto the load bearing table by the rolling shaft while it is rolling.

7. The method according to claim 4, wherein after controlling the adjusting device to adjust the position of said each movable portion on the load bearing table on the basis of the pressure value corresponding to said each movable portion by using the processor, the method further comprises:

arranging a laminar adhesive onto a packaging face of the substrate to be packaged; and forcing the rolling shaft to roll against a surface of the laminar adhesive to package the substrate by the laminar adhesive.

8. A method for packaging a display substrate by using the packaging apparatus according to claim 2, the method comprising:

generating the pressure value corresponding to each movable portion on the basis of the pressure between a rolling shaft and said each movable portion on the load bearing table by using a pressure sensor;

acquiring the pressure value corresponding to said each movable portion by using a processor, the pressure value being generated by the pressure sensor; and controlling the adjusting device to adjust the position of said each movable portion on the load bearing table on the basis of the pressure value corresponding to said each movable portion by using the processor.

9. The method according to claim 8, wherein controlling the adjusting device to adjust the position of said each movable portion on the load bearing table on the basis of the pressure value corresponding to said each movable portion by using the processor comprises:

comparing the pressure value with a predetermined reference value in terms of magnitude by the processor;

in response to the pressure value greater than the predetermined reference value, acquiring a difference between the pressure value and the predetermined reference value by the processor and controlling the adjusting device to drive the movable portion corresponding to the pressure value to move upwardly in the direction perpendicular to the substrate to be packaged on the basis of an absolute value of the difference;

otherwise, in response to the pressure value smaller than the predetermined reference value, acquiring a difference between the pressure value and the predetermined reference value by the processor and controlling the adjusting device to drive the movable portion corresponding to the pressure value to move downwardly in the direction perpendicular to the substrate to be packaged on the basis of an absolute value of the difference.

10. The method according to claim 8, wherein before generating the pressure value corresponding to each movable portion on the basis of the pressure between a rolling shaft and said each movable portion on the load bearing table by using a pressure sensor, the method further comprises:

fixing the substrate to be packaged onto a load bearing surface of the load bearing table such that a face of the substrate opposite to a packaging face of the substrate comes into contact with the load bearing surface of the load bearing table; and forcing the rolling shaft to roll against the packaging face of the substrate to be packaged and applying a pressure onto the load bearing table by the rolling shaft while it is rolling.

11. The method according to claim 8, wherein after controlling the adjusting device to adjust the pressure of each said movable portion on the load bearing table on the basis of the pressure value corresponding to said each movable portion by using the processor, the method further comprises:

arranging a laminar adhesive onto a packaging face of the substrate to be packaged; and forcing the rolling shaft to roll against a surface of the laminar adhesive to package the substrate by the laminar adhesive.

12. The packaging apparatus according to claim 1, wherein the movable portions are arranged in a matrix form.

* * * * *